(12) United States Patent
Ernst

(10) Patent No.: US 11,608,453 B2
(45) Date of Patent: Mar. 21, 2023

(54) BONDING TOOLS FOR BONDING MACHINES, BONDING MACHINES FOR BONDING SEMICONDUCTOR ELEMENTS, AND RELATED METHODS

(71) Applicant: Kulicke and Soffa Industries, Inc., Fort Washington, PA (US)

(72) Inventor: Urban Ernst, Constance (DE)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 341 days.

(21) Appl. No.: 16/254,990

(22) Filed: Jan. 23, 2019

(65) Prior Publication Data

US 2019/0225837 A1 Jul. 25, 2019

Related U.S. Application Data

(60) Provisional application No. 62/621,979, filed on Jan. 25, 2018.

(51) Int. Cl.
*C09J 5/06* (2006.01)
*H01L 23/00* (2006.01)
*F16B 11/00* (2006.01)

(52) U.S. Cl.
CPC ............. *C09J 5/06* (2013.01); *F16B 11/006* (2013.01); *H01L 24/75* (2013.01); *H01L 24/83* (2013.01);
(Continued)

(58) Field of Classification Search
CPC ...... C09J 5/06; C09J 2301/416; F16B 11/006; H01L 24/83; H01L 24/75; H01L 2224/7525; H01L 2224/75744; H01L 2224/83871; H01L 2224/32145; H01L 2224/83868; H01L 2224/83862; H01L 2224/32225; H01L 2224/32245; H01L 2224/83874; H01L 24/32;
(Continued)

(56) References Cited

U.S. PATENT DOCUMENTS 6,783,227 B2 * 8/2004 Suzuki ............... B41J 11/00214
347/102
7,393,095 B2 * 7/2008 Oshima ............. B41J 11/00214
347/102
(Continued)

FOREIGN PATENT DOCUMENTS

JP 2002-141363 A 5/2002
JP 2002141363 A * 5/2002
(Continued)

OTHER PUBLICATIONS

International Seach Report dated May 10, 2019 for International Patent Application No. PCT/US2019/014705.

*Primary Examiner* — Francisco W Tschen
*Assistant Examiner* — Abhishek A Patwardhan
(74) *Attorney, Agent, or Firm* — Christopher M. Spletzer, Sr.

(57) ABSTRACT

A bonding tool for bonding a first workpiece to a second workpiece on a bonding machine is provided. The bonding tool includes a body portion for bonding the first workpiece to the second workpiece on the bonding machine. The bonding tool also includes a curing system for curing an adhesive provided between the first workpiece and the second workpiece.

16 Claims, 8 Drawing Sheets

(52) U.S. Cl.
CPC ......... *C09J 2301/416* (2020.08); *H01L 24/32* (2013.01); *H01L 2224/2929* (2013.01); *H01L 2224/32145* (2013.01); *H01L 2224/32225* (2013.01); *H01L 2224/32245* (2013.01); *H01L 2224/7525* (2013.01); *H01L 2224/75252* (2013.01); *H01L 2224/75744* (2013.01); *H01L 2224/83862* (2013.01); *H01L 2224/83868* (2013.01); *H01L 2224/83871* (2013.01); *H01L 2224/83874* (2013.01)

(58) Field of Classification Search
CPC ... H01L 2224/2929; H01L 2224/75252; H01L 2224/75263; H01L 21/67092; H01L 21/67144; H01L 21/67712; H01L 21/67721
USPC ...................................................... 156/275.7
See application file for complete search history.

(56) References Cited

U.S. PATENT DOCUMENTS

| | | | |
|---|---|---|---|
| 7,395,847 B2* | 7/2008 | Teshirogi | B24B 37/042 |
| | | | 156/580 |
| 9,884,475 B2* | 2/2018 | Nally | B32B 17/10807 |
| 10,227,180 B2* | 3/2019 | Nally | B05C 5/0275 |
| 2008/0233712 A1 | 9/2008 | Sekiya | |
| 2010/0062566 A1 | 3/2010 | Yoshimura et al. | |
| 2016/0111676 A1* | 4/2016 | Ishidai | H01L 51/524 |
| | | | 257/40 |

FOREIGN PATENT DOCUMENTS

| | | |
|---|---|---|
| KR | 10-2005-068018 A | 7/2005 |
| KR | 10-1311647 B1 | 9/2016 |

* cited by examiner

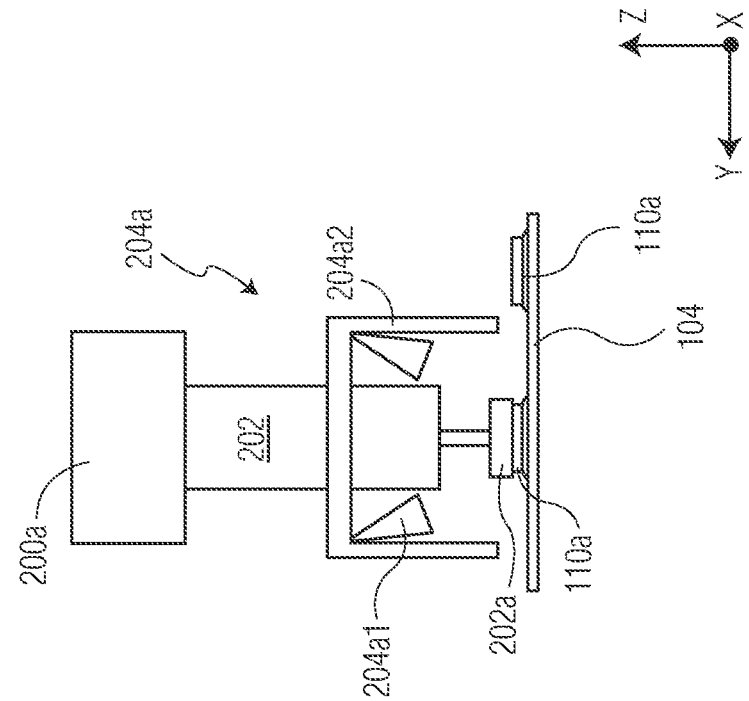
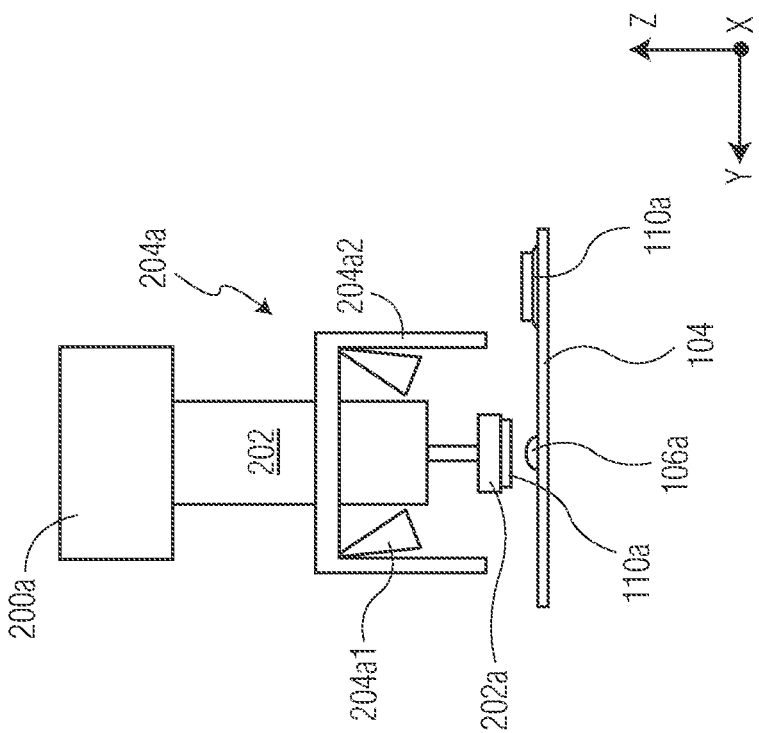

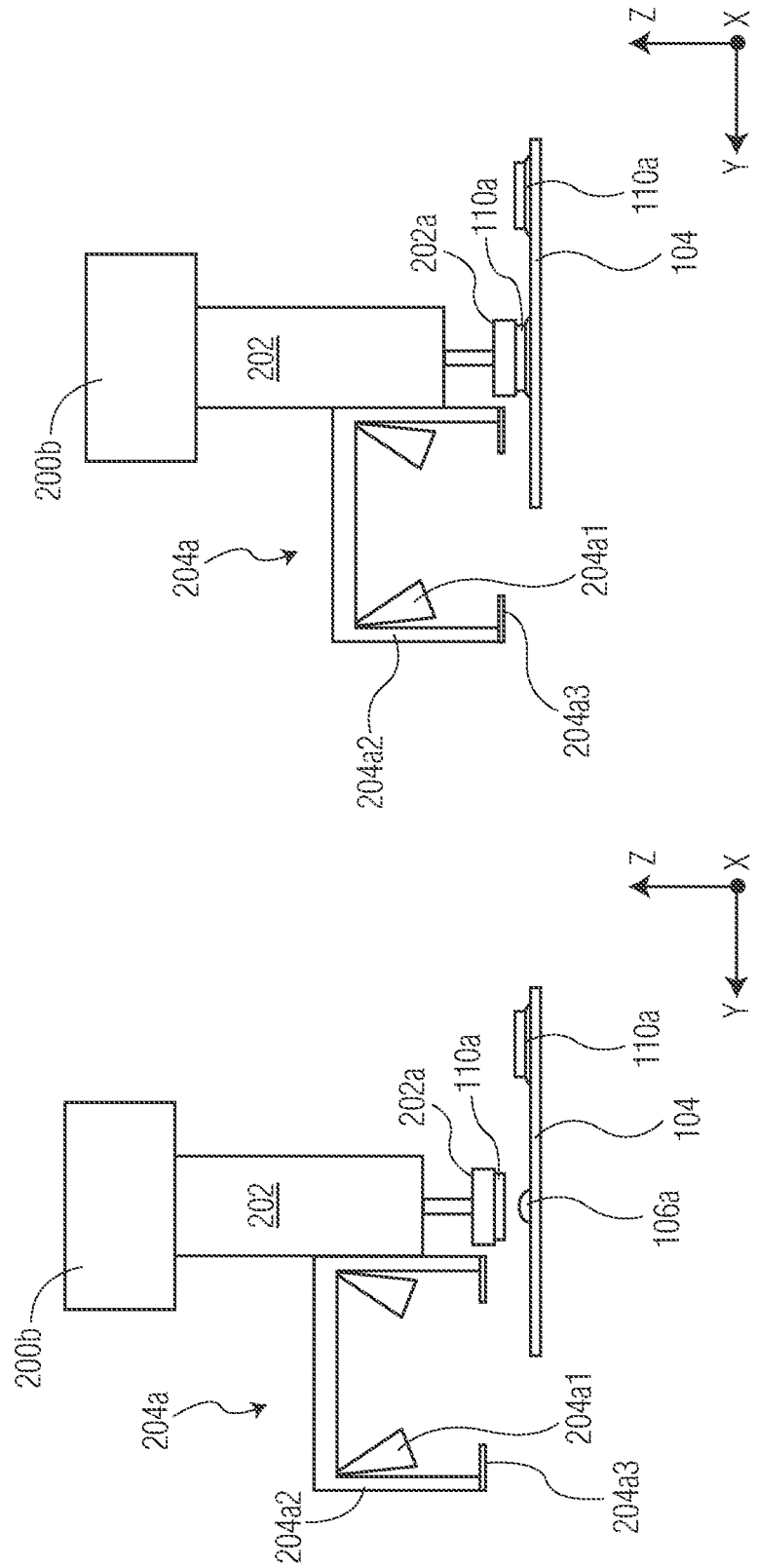

BONDING TOOLS FOR BONDING MACHINES, BONDING MACHINES FOR BONDING SEMICONDUCTOR ELEMENTS, AND RELATED METHODS

CROSS-REFERENCE TO RELATED APPLICATION

This application claims the benefit of U.S. Provisional Application No. 62/621,979 filed on Jan. 25, 2018, the content of which is incorporated herein by reference.

FIELD

The invention relates to the bonding of workpieces (such as semiconductor die bonding, pick and place bonding of workpieces, etc.), and more particularly, to improved bonding tools for curing an adhesive in connection with the workpiece bonding operation.

BACKGROUND

Bonding of workpieces often utilizes an adhesive (e.g., an epoxy based adhesive) in connection with the bonding of a first workpiece to a second workpiece. Exemplary bonding operations include semiconductor die bonding, pick and place bonding of workpieces, etc.

For example, in conventional semiconductor die attach (also known as die bonding) applications, a semiconductor die is bonded (e.g., using an adhesive or the like) to a bonding location of a substrate (e.g., a leadframe, another die in stacked die applications, a spacer, or any other substrate). Other semiconductor elements (i.e., different from a semiconductor die) may be bonded/placed using an adhesive. Other types of workpieces may also be "bonded" on a bonding machine using an adhesive, such as glass substrates.

Curing of the adhesives used in connection with such bonding operations tends to increase production times. Thus, it would be desirable to provide improved bonding tools, bonding machines including such bonding tools, and related methods.

SUMMARY

According to an exemplary embodiment of the invention, a bonding tool for bonding a first workpiece to a second workpiece on a bonding machine is provided. The bonding tool includes a body portion for bonding the first workpiece to the second workpiece on the bonding machine. The bonding tool also includes a curing system for curing an adhesive provided between the first workpiece and the second workpiece.

According to another exemplary embodiment of the invention, a bonding machine for bonding a first workpiece to a second workpiece is provided. The bonding machine includes a bonding tool. The bonding tool includes (a) a body portion for bonding the first workpiece to the second workpiece on the bonding machine, and (b) a curing system for curing an adhesive provided between the first workpiece and the second workpiece. The bonding machine also includes a support structure for supporting the second workpiece during bonding of the first workpiece to the second workpiece using the body portion.

According to yet another exemplary embodiment of the invention, a method of operating a bonding machine is provided. The method includes: (a) carrying a first workpiece with a bonding tool; (b) initiating a bonding process of bonding the first workpiece to a second workpiece using the bonding tool; (c) curing an adhesive provided between the first workpiece and the second workpiece using a curing system of the bonding tool after step (b).

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 3A-3D are block diagram side views illustrating operation of a bonding tool of a bonding machine in accordance with an exemplary embodiment of the invention;

FIG. 4A-4C are block diagram side views illustrating operation of another bonding tool of a bonding machine in accordance with another exemplary embodiment of the invention.

DETAILED DESCRIPTION

Figure 1:
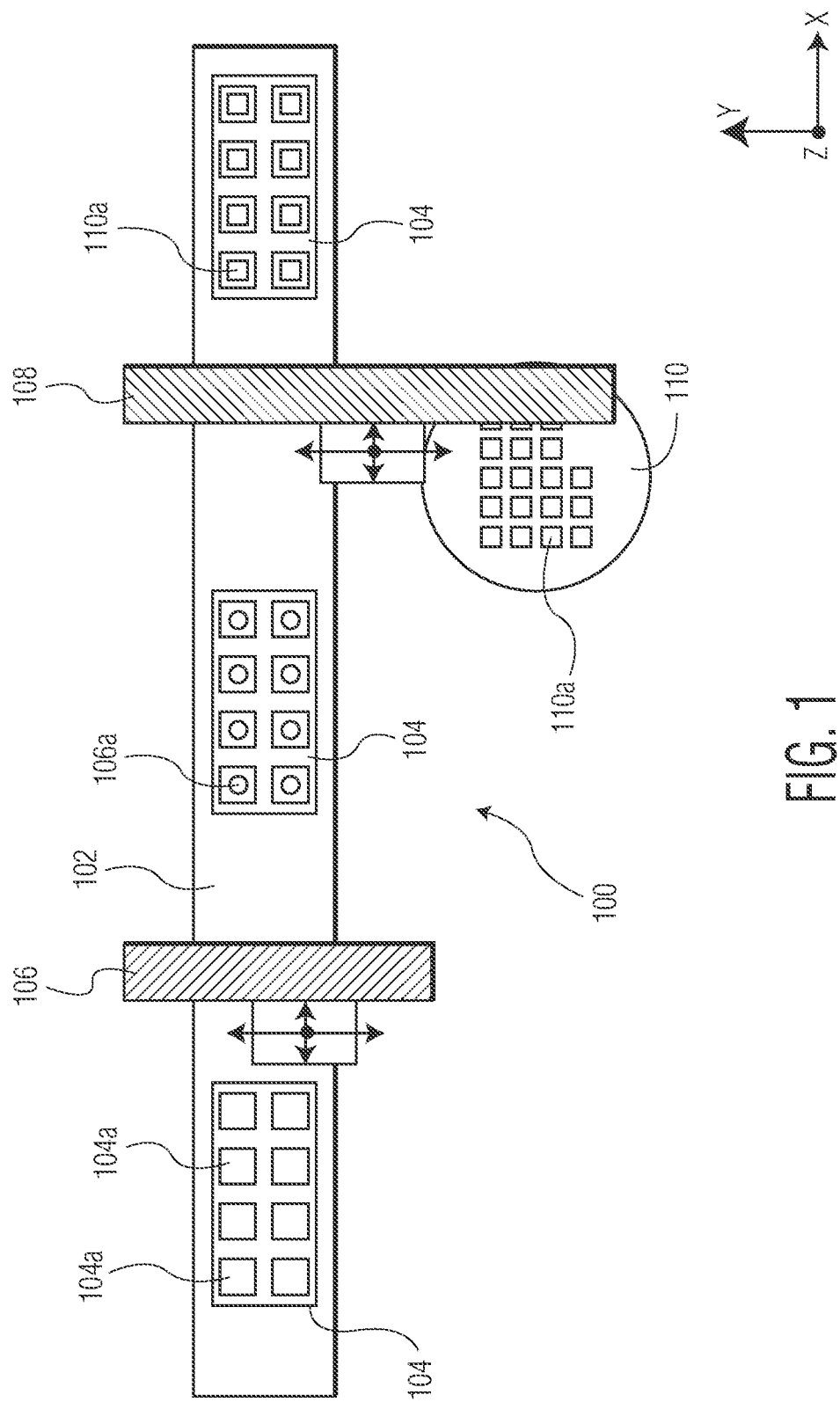
FIG. 1 is an overhead block diagram view of elements of a bonding machine in accordance with an exemplary embodiment of the invention.

As used herein, the term "workpiece" may refer to any type of structure configured to be bonded to another structure, or any type of structure configured to receive another structure during a bonding operation. For example, a first workpiece as described herein may be a semiconductor element, or a substrate (e.g., a glass substrate). In certain applications, the first workpiece may be transparent or translucent. For example, a second workpiece as described herein may be a substrate as defined below.

As used herein, the term "semiconductor element" is intended to refer to any structure including (or configured to include at a later step) a semiconductor chip or die. Exemplary semiconductor elements include a bare semiconductor die, a semiconductor die on a substrate (e.g., a leadframe, a PCB, a carrier, a semiconductor chip, a semiconductor wafer, a BGA substrate, a semiconductor element, etc.), a packaged semiconductor device, a flip chip semiconductor device, a die embedded in a substrate, a stack of semiconductor die, amongst others. Further, the semiconductor element may include an element configured to be bonded or otherwise included in a semiconductor package (e.g., a spacer to be bonded in a stacked die configuration, a substrate, etc.).

As used herein, the term "substrate" is intended to refer to any structure to which a workpiece may be bonded. Exemplary substrates include, for example, a leadframe, a PCB, a carrier, a module, a semiconductor chip, a semicondcutor wafer, a BGA substrate, a semiconductor element, etc.

In accordance with exemplary aspects of the invention, bonding tools of bonding machines are equipped with curing systems for curing an adhesive (e.g., an epoxy) used to bond a first workpiece to a second workpiece. In specific examples: the curing system may be configured to cure the adhesive during the bonding operation (e.g., see FIGS. 3A-3D); the curing system may be configured to cure the adhesive after the bonding operation (e.g., see FIGS. 4A-4C); or the curing system may be configured to cure the adhesive after the bonding operation but while bonding another first workpiece to the second workpiece (e.g., see FIGS. 5A-5C) or to another second workpiece.

Throughout the various drawings, like reference numerals refer to the like elements, except where explained herein.

Referring now to the drawings, FIG. 1 illustrates a top view of bonding machine 100 (e.g., a pick and place machine, a die attach machine, a workpiece bonding machine, etc.). Bonding machine 100 includes a support structure 102 for supporting second workpieces 104 (e.g., a substrate) in connection with a bonding operation. Bonding machine 100 also includes adhesive dispenser 106 configured to dispense an adhesive 106a onto each of the bond sites 104a of a second workpiece 104 prior to the bonding of a first workpiece 110a to the corresponding bond site 104a. Bonding machine also includes a pick and place system 108 configured to: (a) remove a first workpiece 110a from a first workpiece supply 110 (e.g., a semiconductor wafer, or other supply of workpieces); and (b) place the first workpiece 110a onto a corresponding bond site 104a in connection with a bonding operation.

As shown in the progression of FIG. 1, on the left side of support structure 102 is a second workpiece 104 which has not yet received any adhesive 106a from adhesive dispenser 106. In the middle of support structure 102 (downstream from adhesive dispenser 106) is another second workpiece 104 which has received adhesive 106a from adhesive dispenser 106, but has not yet received any first workpieces 110a on top of the dispensed adhesive 106a. On the right side of support structure 102 (downstream from pick and place system 108) is another second workpiece 104 which has received adhesive 106a from adhesive dispenser 106, and which has also received first workpieces 110a on top of the adhesive 106a. Thus, an exemplary process flow is illustrated.

As will be appreciated by those skilled in the art, a single tool (from pick and place system 108) may be used to "pick" a first workpiece 110a from first workpiece supply 110, and to "place" (or bond) the picked first workpiece 110a onto a bond site 104a of second workpiece 104. However, multiple tools (from pick and place system 108) may be used. For example, a pick tool (from pick and place system 108) may be provided to pick the first workpiece 110a from first workpiece supply 110, and then the first workpiece 110a may be transferred to a place tool (from pick and place system 108) which places/bonds the first workpiece 110a onto a corresponding bond site 104a. In yet another example, an intermediate "transfer" tool (or tools) (from pick and place system 108) may be provided between a pick tool and the place tool.

Figure 2:
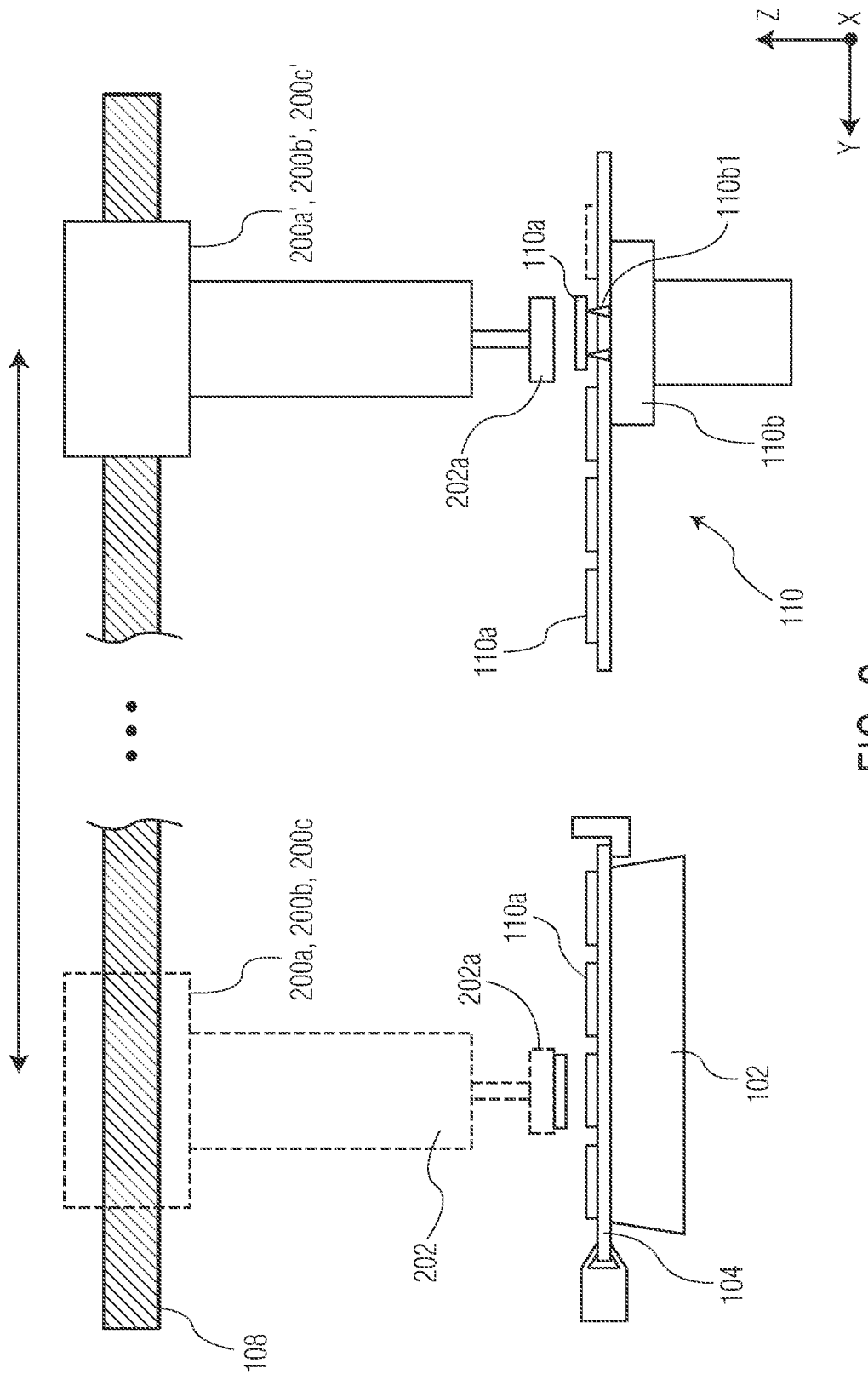
FIG. 2 is a block diagram side view of elements of the bonding machine of FIG. 1.

FIG. 2 illustrates an example of pick and place system 108 from FIG. 1, where a pick tool (200a', 200b', 200c') is be used to "pick" a first workpiece 110a from first workpiece supply 110. Pick tool (200a', 200b', 200c') includes a nozzle 104 (e.g., including vacuum channels or the like) for holding first workpiece 110a. An ejector system 110b, including ejectors 110b1, is provided to assist in the removal of first workpiece 110a from the remainder of first workpiece supply 110.

FIG. 2 also illustrates a bonding tool (200a, 200b, 200c) for bonding the first workpiece 110a to a bond site 104a of second workpiece 104. Second workpiece 104 is supported by support structure 102. The bonding tool (200a, 200b, 200c) includes a body portion 202, including a nozzle 202a for holding the first workpiece 110a prior to, and during, the bonding of the first workpiece 110a to the bond site 104a.

As provided above, the pick tool (200a', 200b', 200c') may be the same as the bonding tool (200a, 200b, 200c). Or they may be different. Thus, in FIG. 2, the space between the pick tool (200a', 200b', 200c') and the bonding tool (200a, 200b, 200c) is intended to illustrate that: the pick tool and the bonding tool may be the same; or that the pick tool and the bonding tool may be different, and that a transfer occurs between them (where such transfer may, or may not, involve one or more intermediate transfer tools).

FIGS. 3A-3D, 4A-4C, and 5A-5C illustrate details of exemplary bonding tools 200a, 200b, 200c of FIG. 2. That is, the bonding tool of FIG. 2 (and thus included in the pick and place system of FIG. 1) may be any of bonding tools 200a, 200b, 200c shown in FIGS. 3A-3D, 4A-4C, and 5A-5C (or any other bonding tool within the scope of the invention).

Figure 3C:
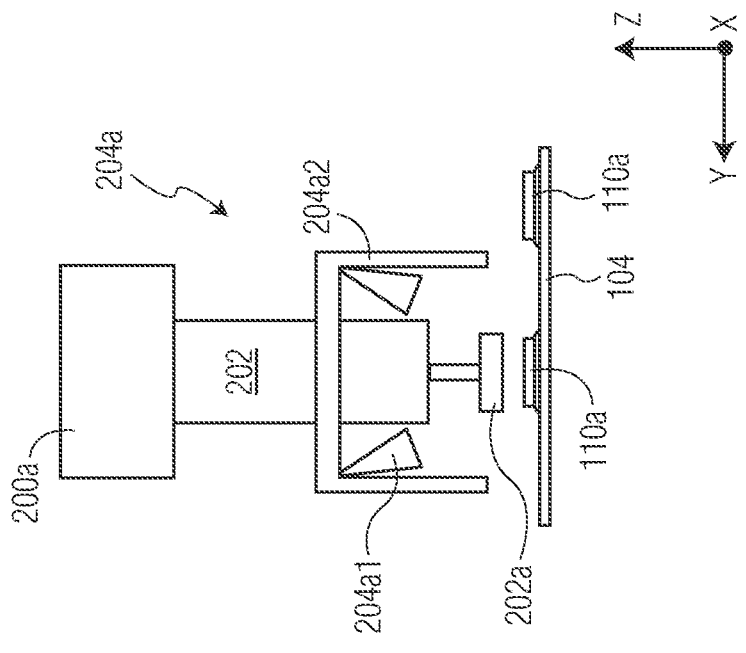
Figure 3D:
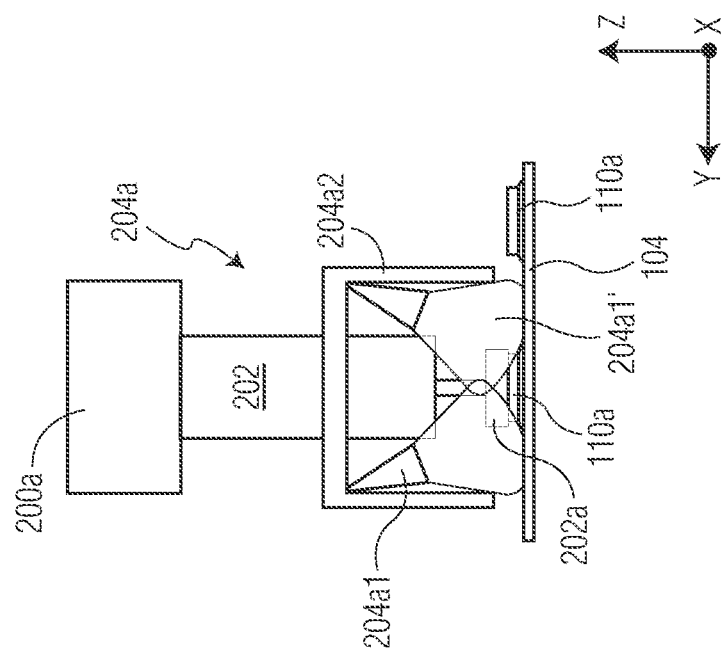

Referring specifically to FIG. 3A, bonding tool 200a includes a body portion 202 for bonding a first workpiece 110a to a bond site area of second workpiece 104. Body portion 202 includes nozzle 202a for holding the first workpiece 110a prior to, and during, the bonding of the first workpiece 110a to the bond site of second workpiece 104. Bonding tool 200a also includes a curing system 204a (e.g., a light based curing system such as a ultraviolet light based curing system, a blue light based curing system, etc.) for providing energy for curing an adhesive. In the example shown in FIGS. 3A-3D (and the examples shown in FIGS. 4A-4C and 5A-5C), curing system 204a may be an ultraviolet (UV) light curing system; however, other types of curing systems (e.g., other types of light source based curing systems, heat based curing systems such as forced air heaters, radiant heaters, etc.) are contemplated.

Curing system 204a includes a plurality of energy sources 204a1 (e.g., light sources such as UV light sources), and wall portions 204a2. Wall portions 204a2 are provided to direct energy (e.g., light such as ultraviolet light, blue light, heat, etc.) from energy sources 204a1 towards the first workpiece 110a for curing the adhesive 106a (e.g., a light activated adhesive). In the configuration of FIGS. 3A-3D, curing of a portion of adhesive 106a may be performed at least partially concurrently with the bonding of the first workpiece 110a to that same portion of adhesive 106a. As shown in FIG. 3A, there is shown an already bonded first workpiece 110a. To the left of this already bonded first workpiece 110a is a portion of adhesive 106a. In FIG. 3B, bonding tool 200a is used to bond another first workpiece 110a to the portion of adhesive 106a. In FIG. 3C, while performing the bonding operation initiated in FIG. 3B, energy 204a1' (e.g., UV light, other light, heat, etc) is provided from energy sources 204a1 (e.g., UV light sources, other light sources, heat sources, etc.) to cure the portion of adhesive 106a under the first workpiece 110a presently being bonded. At FIG. 3D, the operation is complete, as the bonding of the first workpiece 110a to the bond site of second workpiece 104, and the curing of the portion of the adhesive 106a between the first workpiece 110a and the second workpiece 104, is completed. The curing process may take longer than the bonding process; however, the operation is still efficient in terms of time because of the concurrent nature of the bonding and curing processes.

FIGS. 4A-4C and FIGS. 5A-5C are described in connection with ultraviolet light sources for providing ultraviolet light for curing an adhesive. However, it is understood that (like FIGS. 3A-3D) each ultraviolet light source 204a1 may be another type of energy source (e.g., a blue light source, another type of light source, a heat source, etc.) for providing another type of energy (e.g., blue light, another type of light, heat, etc.) for curing an adhesive.

Figure 4C:
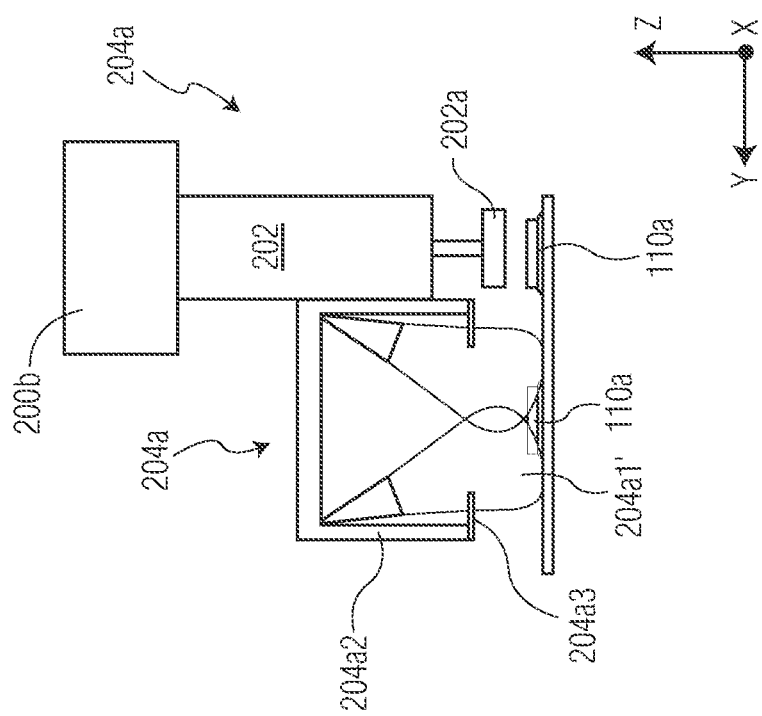

FIGS. 4A-4C illustrate bonding tool 200b including a body portion 202 for bonding a first workpiece 110a to a bond site area of second workpiece 104. Body portion 202 includes nozzle 202a for holding the first workpiece 110a prior to, and during, the bonding of the first workpiece 110a to the bond site of second workpiece 104. Bonding tool 200b also includes a curing system 204a. In contrast to the configuration shown in FIGS. 3A-3D, in FIGS. 4A-4C, curing system 204a is configured to cure a portion of adhesive 106a after bonding of a first workpiece 110a to the portion of adhesive 106a. As shown in FIG. 4A, curing system is secured to (and considered a part of) bonding tool 200b. Thus, it is considered that bonding tool 200b (including curing system 204a) is carried by a common motion system (e.g., through a bond head assembly or the like). Curing system 204a includes a plurality of UV light sources 204a1, and wall portions 204a2. Wall portions 204a2 are provided to direct ultraviolet light from UV light sources 204a1 towards the first workpiece 110a for curing the adhesive 106a. In addition to wall portions 204a2, the embodiment of FIGS. 4A-4C (and 5A-5C) include additional directing structures 204a3 for directing UV light 204a1' as desired. For example, a common curing system 204a may be used for many different applications, but the output UV light may be adjusted using application specific directing structures 204a3.

In the configuration of FIGS. 4A-4C, curing of a portion of adhesive 106a may be performed immediately (or substantially immediately) after the bonding of the first workpiece 110a to that same portion of adhesive 106a. As shown in FIG. 4A, there is shown an already bonded first workpiece 110a. To the left of this already bonded first workpiece 110a is a portion of adhesive 106a. In FIG. 4B, bonding tool 200a is used to bond another first workpiece 110a to the portion of adhesive 106a. In FIG. 4C, after the bonding operation of FIG. 4B is completed, bonding tool 200b is moved to position curing system 204a above the just bonded first workpiece 110a. In this position, UV light 204a1' is provided from UV light sources 204a1 to cure the portion of adhesive 106a under the first workpiece 110a presently being bonded.

Figure 5B:
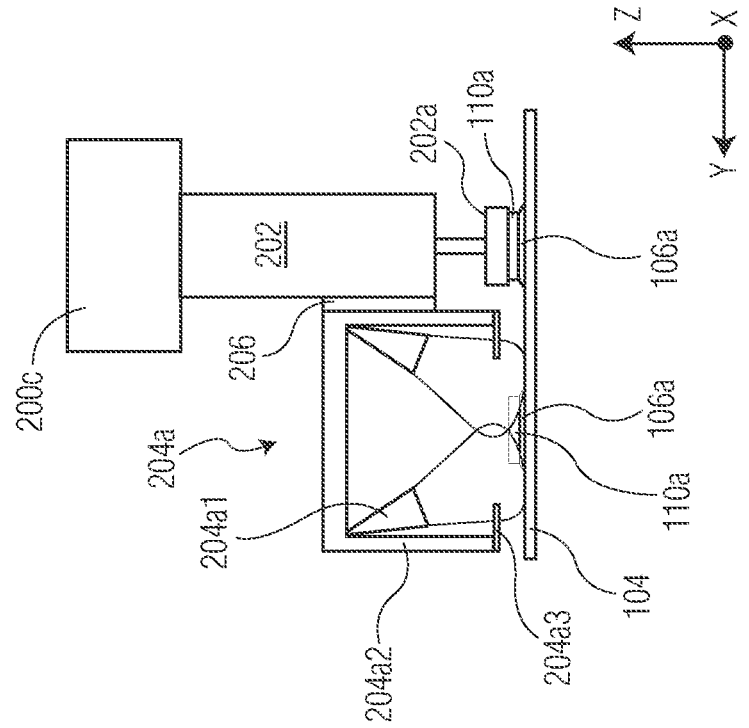
FIG. 5A-5C are block diagram side views illustrating operation of yet another bonding tool of a bonding machine in accordance with yet another exemplary embodiment of the invention.
Figure 5A:
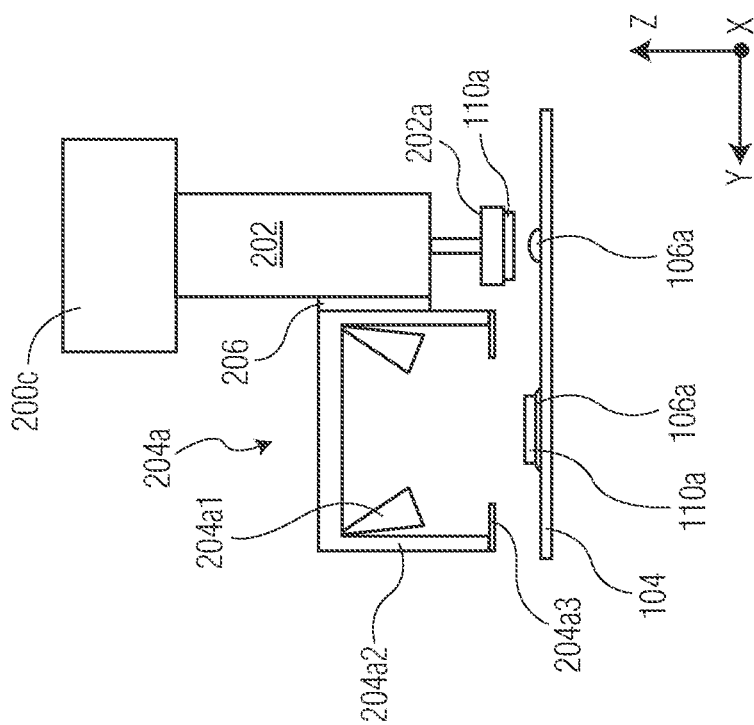
Figure 5C:
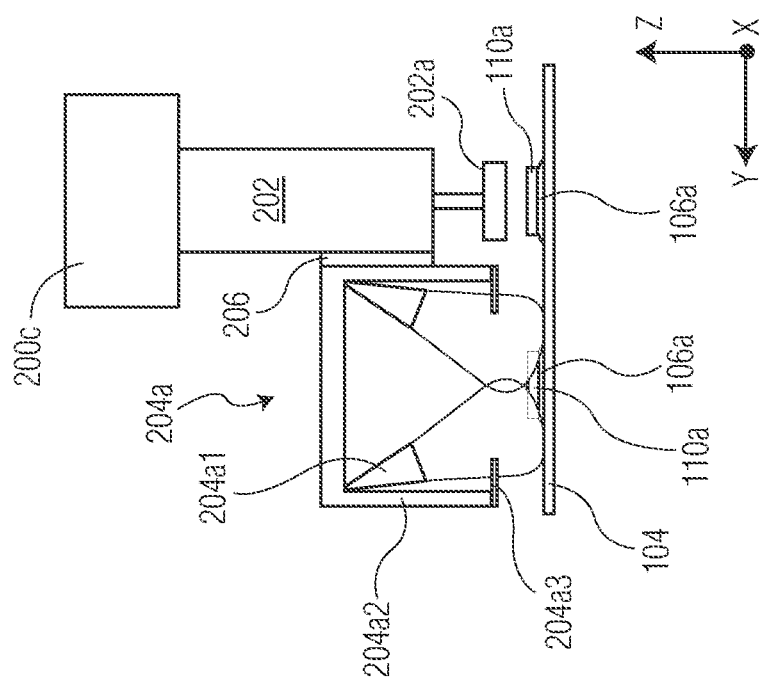

FIGS. 5A-5C illustrate bonding tool 200c including a body portion 202 for bonding a first workpiece 110a to a bond site area of second workpiece 104. Body portion 202 includes nozzle 202a for holding the first workpiece 110a prior to, and during, the bonding of the first workpiece 110a to the bond site of second workpiece 104. Bonding tool 200b also includes a curing system 204a. In contrast to the configurations shown in FIGS. 3A-3D and FIGS. 4A-4C, in FIGS. 5A-5C, curing system 204a is configured to cure a portion of adhesive 106a at least partially during the same time period as the bonding of a different first workpiece 110a. As shown in FIG. 5A, curing system is secured to (and considered a part of) bonding tool 200c. Thus, it is considered that bonding tool 200c (including curing system 204a) is carried by a common motion system (e.g., through a bond head assembly or the like). Curing system 204a includes a plurality of UV light sources 204a1, and wall portions 204a2. Wall portions 204a2 are provided to direct ultraviolet light from UV light sources 204a1 towards the first workpiece 110a for curing the adhesive 106a. In addition to wall portion 204a2, additional directing structures 204a3 are provided for directing UV light 204a1' as desired. For example, a common curing system 204a may be used for many different applications, but the output UV light may be adjusted using application specific directing structures 204a3.

In the configuration of FIGS. 5A-5C, curing of a portion of adhesive 106a may be performed at least partially concurrently with the bonding of another first workpiece 110a to a different portion of adhesive 106a. As shown in FIG. 5A, there is shown an already bonded first workpiece 110a under curing system 204a. To the right of this already bonded (but not yet cured) first workpiece 110a is a portion of adhesive 106a. In FIG. 5B, bonding tool 200c is used to bond another first workpiece 110a to the portion of adhesive 106a, while curing system 204a is used to direct UV light 204a1' from UV light sources 204a1 to cure the portion of adhesive 106a under the first workpiece 110a that was already bonded.

FIGS. 5A-5C also illustrate spacer 206. As will be appreciated by those skilled in the art, it may be desirable to use a common curing system across multiple applications with different spatial requirements. Spacer 206 is provided to illustrate that a spacer (e.g., an adjustable mechanism) may be provided to allow for the spacing requirements of different applications.

The embodiments of FIGS. 3A-3D, 4A-4C, and 5A-5C are exemplary in nature. Different configurations are contemplated within the scope of the invention. Further, the present invention is primarily described with respect to UV light sources for providing the curing of the adhesives; however, it is understood that different types of energy sources (such as blue light sources, other light sources, heat sources) may be utilized.

The use of UV light sources in connection with the invention may find particular application in the case where the first workpieces are glass substrates which may transparent and/or translucent, such that the UV light may efficiently cure the adhesive under the glass substrate.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A bonding tool for bonding a semiconductor element to a substrate on a bonding machine, the bonding tool comprising:
a body portion for bonding the semiconductor element to the substrate on the bonding machine, the body portion including a nozzle, the nozzle including a vacuum channel for holding the semiconductor element prior to bonding of the semiconductor element to a bond site area of the substrate; and
a curing system for curing an adhesive provided between the semiconductor element and the substrate, the curing system including wall portions for directing ultraviolet light from an ultraviolet light source towards the semiconductor element for curing the adhesive,
wherein the bonding tool, including the body portion and the curing system, moves to bond the semiconductor element to the substrate, the movement of the bonding tool including at least a motion component along a z-axis of the bonding machine,
wherein (i) the wall portions are positioned on either side of the nozzle, or (ii) one of the wall portions is coupled to the body portion such that the curing system is on one side of the nozzle.

2. The bonding tool of claim 1 wherein the curing system includes a heater for heating the adhesive.

3. The bonding tool of claim 1 wherein the curing system is configured to cure the adhesive during bonding of the semiconductor element to the substrate using the body portion.

4. The bonding tool of claim 1 wherein the curing system is configured to cure the adhesive after bonding of the semiconductor element to the substrate using the body portion.

5. The bonding tool of claim 1 wherein the curing system is configured to cure the adhesive while the body portion bonds another semiconductor element to the substrate.

6. The bonding tool of claim 1 wherein the semiconductor element includes a semiconductor die.

7. The bonding tool of claim 1 wherein the semiconductor element is a glass substrate.

8. The bonding tool of claim 1 wherein the semiconductor element is transparent.

9. The bonding tool of claim 1 wherein the semiconductor element is translucent.

10. A bonding machine for bonding a semiconductor element to a substrate, the bonding machine comprising:
  a bonding tool, the bonding tool including (a) a body portion for bonding the semiconductor element to the substrate on the bonding machine, the body portion including a nozzle, the nozzle including a vacuum channel for holding the semiconductor element prior to bonding of the semiconductor element to a bond site area of the substrate, and (b) a curing system for curing an adhesive provided between the semiconductor element and the substrate, the curing system including wall portions for directing ultraviolet light from an ultraviolet light source towards the semiconductor element for curing the adhesive, wherein (i) the wall portions are positioned on either side of the nozzle, or (ii) one of the wall portions is coupled to the body portion such that the curing system is on one side of the nozzle; and
  a support structure for supporting the substrate during bonding of the semiconductor element to the substrate using the body portion,
  wherein the bonding tool, including the body portion and the curing system, moves to bond the semiconductor element to the substrate, the movement of the bonding tool including at least a motion component along a z-axis of the bonding machine.

11. The bonding machine of claim 10 further comprising a motion system for carrying the bonding tool including the curing system.

12. The bonding machine of claim 10 wherein the bonding machine is a die attach machine, and the bonding tool is a die attach tool.

13. A method of operating a bonding machine, the method comprising the steps of:
  (a) carrying a semiconductor element with a bonding tool, wherein the bonding tool, including (i) a body portion, the body portion including a nozzle, the nozzle including a vacuum channel for holding the semiconductor element prior to bonding and (ii) a curing system, moves to bond the semiconductor element to a substrate, the movement of the bonding tool including at least a motion component along a z-axis of the bonding machine, wherein (i) the wall portions are positioned on either side of the nozzle, or (ii) one of the wall portions is coupled to the body portion such that the curing system is on one side of the nozzle;
  (b) initiating a bonding process of bonding the semiconductor element to the substrate using the bonding tool; and
  (c) curing an adhesive provided between the semiconductor element and the substrate using the curing system of the bonding tool, the curing system including wall portions for directing ultraviolet light from an ultraviolet light source towards the semiconductor element for curing the adhesive.

14. The method of claim 13 wherein step (c) occurs concurrently with at least a portion of step (b).

15. The method of claim 13 wherein step (c) occurs after completion of the bonding process initiated in step (b).

16. The method of claim 13 wherein step (c) occurs after completion of the bonding process initiated in step (b), and at least partially during the bonding of another semiconductor element to another portion of the substrate.

* * * * *